United States Patent
Kim et al.

(10) Patent No.: US 9,039,940 B2
(45) Date of Patent: May 26, 2015

(54) CONDUCTIVE PASTE AND ELECTRONIC DEVICE, AND SOLAR CELL INCLUDING AN ELECTRODE FORMED USING THE CONDUCTIVE PASTE

(75) Inventors: Suk Jun Kim, Gyeonggi-do (KR); Eun Sung Lee, Seoul (KR); Se Yun Kim, Seoul (KR); Sang Soo Jee, Hwaseong-si (KR); Jeong Na Heo, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 459 days.

(21) Appl. No.: 13/416,260

(22) Filed: Mar. 9, 2012

(65) Prior Publication Data

US 2012/0240994 A1 Sep. 27, 2012

(30) Foreign Application Priority Data

Mar. 25, 2011 (KR) .................. 10-2011-0027011

(51) Int. Cl.
*H01B 1/02* (2006.01)
*H01L 31/0224* (2006.01)
*H01B 1/22* (2006.01)

(52) U.S. Cl.
CPC .......... *H01L 31/022425* (2013.01); *H01B 1/22* (2013.01); *Y02E 10/50* (2013.01)

(58) Field of Classification Search
CPC .. H01L 31/022425; H01B 1/22; H01B 1/026; Y02E 10/50
USPC ............ 252/512–514; 136/252, 256; 438/618
See application file for complete search history.

(56) References Cited

U.S. PATENT DOCUMENTS

| | | |
|---|---|---|
| 5,170,930 A | 12/1992 | Dolbear et al. |
| 6,120,586 A | 9/2000 | Harada et al. |
| 7,794,553 B2 | 9/2010 | Duan et al. |
| 8,168,886 B2 | 5/2012 | Akimoto |
| 2005/0211340 A1 | 9/2005 | Kim et al. |
| 2006/0137778 A1 | 6/2006 | Munir et al. |
| 2007/0034305 A1 | 2/2007 | Suh |
| 2008/0146016 A1* | 6/2008 | Schwirtlich et al. .......... 438/618 |
| 2010/0021704 A1 | 1/2010 | Yoon et al. |
| 2010/0037990 A1 | 2/2010 | Suh |
| 2010/0170562 A1 | 7/2010 | Akimoto |
| 2010/0227433 A1 | 9/2010 | Konno |

(Continued)

FOREIGN PATENT DOCUMENTS

| | | |
|---|---|---|
| EP | 1 480 233 | 11/2004 |
| EP | 2 325 848 | 5/2011 |

(Continued)

OTHER PUBLICATIONS

PCT Search Report dated Mar. 18, 2013 for PCT/KR2012-009528.

(Continued)

*Primary Examiner* — Khanh Tuan Nguyen
(74) *Attorney, Agent, or Firm* — Harness, Dickey & Pierce, PLC (57) ABSTRACT

A conductive paste may include a conductive component and an organic vehicle. The conductive component may include an amorphous metal. The amorphous metal may have a lower resistivity after a crystallization process than before the crystallization process, and at least one of a weight gain of about 4 mg/cm$^2$ or less and a thickness increase of about 30 μm or less after being heated in a process furnace at a firing temperature.

30 Claims, 9 Drawing Sheets

(56) References Cited

U.S. PATENT DOCUMENTS

| | | |
|---|---|---|
| 2011/0000531 A1 | 1/2011 | Kwag et al. |
| 2011/0114170 A1 | 5/2011 | Lee et al. |
| 2011/0192457 A1 | 8/2011 | Nakayama et al. |
| 2012/0037223 A1 | 2/2012 | Yamanaka et al. |

FOREIGN PATENT DOCUMENTS

| | | |
|---|---|---|
| JP | 08-064029 | 3/1996 |
| JP | 2003-217347 | 7/2003 |
| JP | 2004-250308 | 9/2004 |
| JP | 2005-093391 | 4/2005 |
| JP | 2009-087957 | 4/2009 |
| JP | 2009-099371 | 5/2009 |
| JP | 2009-138266 | 6/2009 |
| JP | 2010-018878 | 1/2010 |
| JP | 2010-238570 | 10/2010 |
| KR | 10 1998-057847 | 9/1998 |
| KR | 1998-0057847 A | 9/1998 |
| KR | 10 2002-0037772 | 5/2002 |
| KR | 10-2004-0080522 | 9/2004 |
| KR | 10 2005-0096258 | 10/2005 |
| KR | 10 0720940 | 5/2007 |
| KR | 10-2007-0106887 | 11/2007 |
| KR | 10 2008-0025762 | 3/2008 |
| KR | 10 2008 0029655 | 4/2008 |
| KR | 10 2008 0029826 | 4/2008 |
| KR | 10 2009-0115252 | 11/2009 |
| KR | 10 2010 0028493 | 3/2010 |
| KR | 10 2010 0048196 | 5/2010 |
| KR | 10 2010 0133867 | 12/2010 |
| KR | 10 2011-0003803 | 1/2011 |
| KR | 10 2011-0040090 | 4/2011 |
| KR | 10 2011-0052452 | 5/2011 |
| KR | 10 2011 0098549 | 9/2011 |
| KR | 10-201-0112768 | 10/2011 |
| WO | WO 01/31085 | 5/2001 |

OTHER PUBLICATIONS

Hilali, M.M., et al. "Effect of Ag Particle Size in Thick-Film Ag Paste on the Electrical and Physical Properties of Screen Printed Contacts and Silicon Solar Cells", Journal of the Electrochemical Society. 153 (1) A5-A11 (2006).

Schubert, G. et al. "Current Transport Mechanism in Printed Ag Thick Film Contacts to an N-type Emitter of a Crystalline Silicon Solar Cell", University of Konstanz, Germany.

B Hoex et al. "On the c-Si surface passivation mechanism by the negative-chargedielectric Al2O3"; Journal of Applied Physics 104, 113703; 2008.

K. Nakamura et al. "Development of 20% Efficiency Mass Production Si Solar Cells"; 20th European Photovoltaic Solar Energy Conference; Barcelona, Spain; Jun. 2005.

U.S. Office Action for corresponding U.S. Appl. No. 13/534,799 mailed Dec. 23, 2014.

V. Martinac "Effect of $TiO_2$ Addition on the Sintering Process of Magnesium Oxide from Seawater"; Sintering of Ceramics—New Emerging Techniques, p. 309-322; Mar. 2012.

\* cited by examiner

FIG. 9

CONDUCTIVE PASTE AND ELECTRONIC DEVICE, AND SOLAR CELL INCLUDING AN ELECTRODE FORMED USING THE CONDUCTIVE PASTE

CROSS-REFERENCE TO RELATED APPLICATION

This application claims priority to and the benefit of Korean Patent Application No. 10-2011-0027011 filed in the Korean Intellectual Property Office on Mar. 25, 2011, the entire contents of which are incorporated herein by reference.

BACKGROUND

1. Field

Example embodiments relate to a conductive paste, and an electronic device and a solar cell including an electrode formed using the conductive paste.

2. Description of the Related Art

A solar cell is a photoelectric conversion device that transforms solar energy into electrical energy. Solar cells have attracted attention as a potentially infinite and pollution-free next generation energy source.

A solar cell includes p-type and n-type semiconductors. When an electron-hole pair ("EHP") is produced by light absorbed in a photoactive layer of the semiconductors, the solar cell produces electrical energy by transferring electrons and holes to the n-type and p-type semiconductors, respectively, and then collecting the electrons and holes in electrodes of the solar cell.

A solar cell should desirably have the highest possible efficiency for producing electrical energy from solar energy. In order to improve this efficiency, the solar cell desirably absorbs light with minor loss so that the solar cell may produce as many electron-hole pairs as possible, and collect the produced charges.

An electrode may be fabricated by a deposition method, which may include a relatively complicated process, have a higher cost, and can take a relatively long time. Accordingly, a simplified process, e.g., by screen printing a conductive paste including a conductive material, has been suggested.

SUMMARY

Example embodiments provide a conductive paste including a main component of a conductive powder consisting of a low-resistance metal, for example, silver (Ag). However, the cost of the conductive powder accounts for a great part of the process cost because it is a generally expensive metal.

Example embodiments provide a conductive paste that replaces the conductive powder and lowers the amount of the conductive powder, thereby reducing costs. Example embodiments also provide an electronic device including an electrode including a product of the conductive paste. Example embodiments also provide a solar cell including an electrode including a product of the conductive paste.

According to example embodiments, a conductive paste may include a conductive component including an amorphous metal and an organic vehicle. The amorphous metal may have a lower resistivity after a crystallization process than before the crystallization process, and at least one of a weight gain of about 4 mg/cm$^2$ or less and a thickness increase of about 30 µm or less after being heated in a process furnace at a firing temperature.

The resistivity of the amorphous metal may be lower by about 5% or more after the crystallization process. The resistivity of the amorphous metal may be lower by about 10% to about 99% after the crystallization process. The amorphous metal may be crystallized by a heat treatment in a process furnace at a temperature ranging from about 300° C. to about 800° C. and exposure to air. The weight gain of the amorphous metal may range from about 0.0001 mg/cm$^2$ to about 4 mg/cm$^2$. The firing temperature may range from about 300° C. to about 1,000° C.

The at least one of weight gain and thickness increase of the amorphous metal may be measured when the conductive paste is heat-treated from room temperature up to the firing temperature at a speed of about 40K/min or more. The thickness increase of the amorphous metal may be equal to the thickness of an oxide layer of the amorphous metal when the conductive paste is heated up to the firing temperature.

The amorphous metal may include at least one of aluminum (Al), nickel (Ni), copper (Cu), zirconium (Zr), iron (Fe), calcium (Ca), cobalt (Co), tin (Sn), zinc (Zn), tantalum (Ta), magnesium (Mg), lanthanum (La), niobium (Nb), lead (Pb), neodymium (Nd), gadolinium (Gd), scandium (Sc), yttrium (Y), ytterbium (Yb), cerium (Ce), sodium (Na), barium (Ba), potassium (K), rubidium (Rb), cesium (Cs), lithium (Li), mercury (Hg), hafnium (Hf), antimony (Sb), cadmium (Cd), indium (In), bismuth (Bi), tungsten (W), vanadium (V), arsenic (As), gallium (Ga), germanium (Ge), manganese (Mn), technetium (Tc), beryllium (Be), rhodium (Rh), iridium (Ir), chromium (Cr), osmium (Os), ruthenium (Ru), rhenium (Re), molybdenum (Mo), palladium (Pd), platinum (Pt), gold (Au), carbon (C), silicon (Si), phosphorus (P), and boron (B).

The amorphous metal may be included in the conductive component in an amount of about 5 wt % to about 100 wt % based on a total wt % of the conductive component. The conductive component may further include a metal powder. The metal powder may include at least one of silver (Ag), aluminum (Al), copper (Cu), and nickel (Ni). The amorphous metal and the metal powder may be included in amounts of about 5 wt % to about 95 wt %, respectively, based on a total wt % of the conductive component. The conductive paste may further include a binder. The binder may include at least one of glass frit and metallic glass.

According to example embodiments, an electronic device may include an electrode including a fired conductive paste, the fired conductive paste including a conductive component. The conductive component may include an amorphous metal having a lower resistivity after a crystallization process than before the crystallization process, and at least one of a weight gain of about 4 mg/cm$^2$ or less and a thickness increase of about 30 µm or less after being heated in a process furnace at a firing temperature.

The resistivity of the amorphous metal may be lower by about 5% or more after the crystallization process. The resistivity of the amorphous metal may be lower by about 10% to about 99% after the crystallization process.

The amorphous metal may include at least one of aluminum (Al), nickel (Ni), copper (Cu), zirconium (Zr), iron (Fe), calcium (Ca), cobalt (Co), tin (Sn), zinc (Zn), tantalum (Ta), magnesium (Mg), lanthanum (La), niobium (Nb), lead (Pb), neodymium (Nd), gadolinium (Gd), scandium (Sc), yttrium (Y), ytterbium (Yb), cerium (Ce), sodium (Na), barium (Ba), potassium (K), rubidium (Rb), cesium (Cs), lithium (Li), mercury (Hg), hafnium (Hf), antimony (Sb), cadmium (Cd), indium (In), bismuth (Bi), tungsten (W), vanadium (V), arsenic (As), gallium (Ga), germanium (Ge), manganese (Mn), technetium (Tc), beryllium (Be), rhodium (Rh), iridium (Ir), chromium (Cr), osmium (Os), ruthenium (Ru), rhenium (Re), molybdenum (Mo), palladium (Pd), platinum (Pt), gold (Au), carbon (C), silicon (Si), phosphorus (P), and boron (B).

The conductive component may further include a metal powder. The metal powder may include at least one of silver (Ag), aluminum (Al), copper (Cu), and nickel (Ni).

According to example embodiments, a solar cell may include a semiconductor layer, and an electrode electrically connected to the semiconductor layer. The electrode may include a fired conductive paste that includes a conductive component. The conductive component may include an amorphous metal having a lower resistivity after a crystallization process than before the crystallization process, and at least one of a weight gain of about 4 mg/cm$^2$ or less and a thickness increase of about 30 µm or less after being heated in a process furnace at a firing temperature.

The resistivity of the amorphous metal may be lower by about 5% or more after the crystallization process. The resistivity of the amorphous metal may be lower by about 10% to about 99% after the crystallization process.

The amorphous metal may include at least one of aluminum (Al), nickel (Ni), copper (Cu), zirconium (Zr), iron (Fe), calcium (Ca), cobalt (Co), tin (Sn), zinc (Zn), tantalum (Ta), magnesium (Mg), lanthanum (La), niobium (Nb), lead (Pb), neodymium (Nd), gadolinium (Gd), scandium (Sc), yttrium (Y), ytterbium (Yb), cerium (Ce), sodium (Na), barium (Ba), potassium (K), rubidium (Rb), cesium (Cs), lithium (Li), mercury (Hg), hafnium (Hf), antimony (Sb), cadmium (Cd), indium (In), bismuth (Bi), tungsten (W), vanadium (V), arsenic (As), gallium (Ga), germanium (Ge), manganese (Mn), technetium (Tc), beryllium (Be), rhodium (Rh), iridium (Ir), chromium (Cr), osmium (Os), ruthenium (Ru), rhenium (Re), molybdenum (Mo), palladium (Pd), platinum (Pt), gold (Au), carbon (C), silicon (Si), phosphorus (P), and boron (B).

The amorphous metal may be included in the conductive component in an amount of about 5 wt % to about 100 wt % based on a total wt % of the conductive component. The conductive component may further include a metal powder. The amorphous metal and the metal powder may be included in amounts of about 5 wt % to about 95 wt %, respectively, based on a total wt % of the conductive component.

The solar cell may further include a buffer layer on a first region of the semiconductor layer, and the electrode on a second region of the semiconductor layer different from the first region. The buffer layer may include at least one of a fired product of glass frit and metallic glass.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein.

DETAILED DESCRIPTION

Example embodiments will be hereinafter described in further detail with reference to the accompanying drawings, in which various embodiments are shown. This disclosure may, however, be embodied in many different forms and should not be construed as limited to example embodiments set forth herein.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, the term "element" refers to a metal and a semi-metal.

A conductive paste according to example embodiments may include a conductive component and an organic vehicle. The conductive component may include an amorphous metal.

The amorphous metal may be an alloy having a disordered atomic structure including two or more elements, and in general, may have an amorphous state or at least a partial crystalline state. The amorphous metal may have relatively low resistivity and thus may have conductivity, unlike a conventional glass, e.g., silicate.

The amorphous metal may include aluminum (Al), nickel (Ni), copper (Cu), zirconium (Zr), iron (Fe), calcium (Ca), cobalt (Co), tin (Sn), zinc (Zn), tantalum (Ta), magnesium (Mg), lanthanum (La), niobium (Nb), lead (Pb), neodymium (Nd), gadolinium (Gd), scandium (Sc), yttrium (Y), ytterbium (Yb), cerium (Ce), sodium (Na), barium (Ba), potassium (K), rubidium (Rb), cesium (Cs), lithium (Li), mercury (Hg), hafnium (Hf), antimony (Sb), cadmium (Cd), indium (In), bismuth (Bi), tungsten (W), vanadium (V), arsenic (As), gallium (Ga), germanium (Ge), manganese (Mn), technetium (Tc), beryllium (Be), rhodium (Rh), iridium (Ir), chromium (Cr), osmium (Os), ruthenium (Ru), rhenium (Re), molybdenum (Mo), palladium (Pd), platinum (Pt), gold (Au), carbon (C), silicon (Si), phosphorus (P), boron (B), or a combination thereof.

The amorphous metal may replace at least a portion of metal powder in a conductive paste. Accordingly, the amorphous metal may replace an expensive metal powder and thus lower the manufacturing cost. The amorphous metal may replace at least a portion of metal powder under the following conditions.

The amorphous metal may have lower resistivity before crystallization than after crystallization. When an amorphous metal has higher resistivity after crystallization, the amorphous metal may deteriorate overall conductivity of a conductive paste. Thus, the amorphous metal may not replace at least a portion of metal powder.

Herein, when an amorphous metal is heat-treated at a temperature ranging from about 300° C. to about 800° C. while being exposed to air and crystallized, the amorphous metal may have lower resistivity after crystallization than before crystallization by at least about 5% or more. In particular, the amorphous metal may have lower resistivity after crystallization than before crystallization by about 10% to about 99%.

The following Table 1 shows resistivity change ($\Delta\rho$) of various amorphous metals before and after crystallization.

TABLE 1

| Amorphous metal | P ($\mu\Omega$cm, initial) | $\rho'$ ($\mu\Omega$cm, 600° C.) | $\Delta\rho$ ($\rho'$ − $\rho$) | Resistivity decrease ratio (%) |
|---|---|---|---|---|
| $Al_{86}Ni_8Y_6$ | 127 | 25 | 102 | 80 |
| $Al_{84.5}Ni_{5.5}Y_{10}$ | 74 | 12 | 62 | 84 |
| $Al_{86}Ni_6Co_2Y_6$ | 158 | 24 | 134 | 85 |
| $Al_{87}Y_7Fe_5Ti_1$ | 132 | 21 | 111 | 84 |
| $Al_{88}Y_7Fe_5$ | 120 | 24 | 96 | 80 |
| $Al_{86}Ni_6Co_2Y_6$ | 58 | 24 | 34 | 59 |
| $Al_{87}Y_7Fe_5Ti_1$ | 132 | 21 | 111 | 84 |
| $Al_{88}Y_7Fe_5$ | 120 | 24 | 96 | 80 |
| $Al_{86}La_5Ni_9$ | 76 | 14 | 62 | 82 |
| $Al_{86}La_6Ni_8$ | 116 | 17 | 99 | 85 |
| $Al_{85}La_6Ni_9$ | 123 | 15 | 108 | 88 |
| $Al_{85}La_5Ni_{10}$ | 123 | 19 | 104 | 85 |
| $Al_{85.5}Ni_{9.5}La_5$ | 153 | 18 | 135 | 88 |
| $Ni_{59}Zr_{20}Ti_{21}$ | 518 | 341 | 177 | 34 |
| $Ni_{59}Zr_{20}Ti_{16}Sn_5$ | 554 | 383 | 171 | 31 |
| $Ni_{59}Zr_{20}Ti_{16}Sn_3Si_2$ | 548 | 428 | 120 | 22 |
| $Ni_{45}Zr_{25}Ti_{20}Al_{10}$ | 235 | 194 | 41 | 17 |
| $Ni_{39.8}Zr_{27.86}Cu_{5.97}Ti_{15.92}Al_{9.95}Si_{0.5}$ | 299 | 234 | 65 | 22 |
| $Cu_{50}Zr_{50}$ | 232 | 167 | 65 | 28 |
| $Cu_{46}Zr_{46}Al_8$ | 207 | 161 | 46 | 22 |
| $Cu_{58.1}Zr_{35.9}Al_6$ | 256 | 192 | 64 | 25 |
| $Cu_{45}Zr_{45}Ag_{10}$ | 195 | 167 | 28 | 14 |
| $Cu_{43}Zr_{43}Al_7Ag_7$ | 218 | 186 | 32 | 15 |
| $Zr_{48}Cu_{28}Al_8Ag_8Ni_8$ | 205 | 137 | 68 | 33 |
| $Zr_{48}Cu_{34}Al_8Ag_8Ni_2$ | 533 | 456 | 77 | 14 |

The amorphous metal needs to secure oxidation-resistance. Because the conductive paste is generally processed in air, the conductive paste may be easily exposed to oxygen. When the amorphous metal is easily oxidized, the conductivity of the conductive paste may be remarkably deteriorated, thereby ensuring the oxidation resistance of amorphous metal.

The oxidation resistance of amorphous metal may be confirmed by a weight gain or a thickness increase when heated in a process furnace to a firing temperature. The weight gain refers to an increased weight due to an amorphous metal oxide generated by the oxidation. The increased thickness indicates the increased thickness of an oxide layer formed due to oxidation of an amorphous metal.

Herein, as the weight gain or thickness of an amorphous metal oxide increases, the oxidation resistance may become lower. As the weight gain or thickness decreases, the oxidation resistance may become higher.

An amorphous metal has higher oxidation resistance than pure metal powder included in the amorphous metal as a main component. Hereinafter, the amorphous metal will be illustrated referring to FIG. 1.

Figure 1:
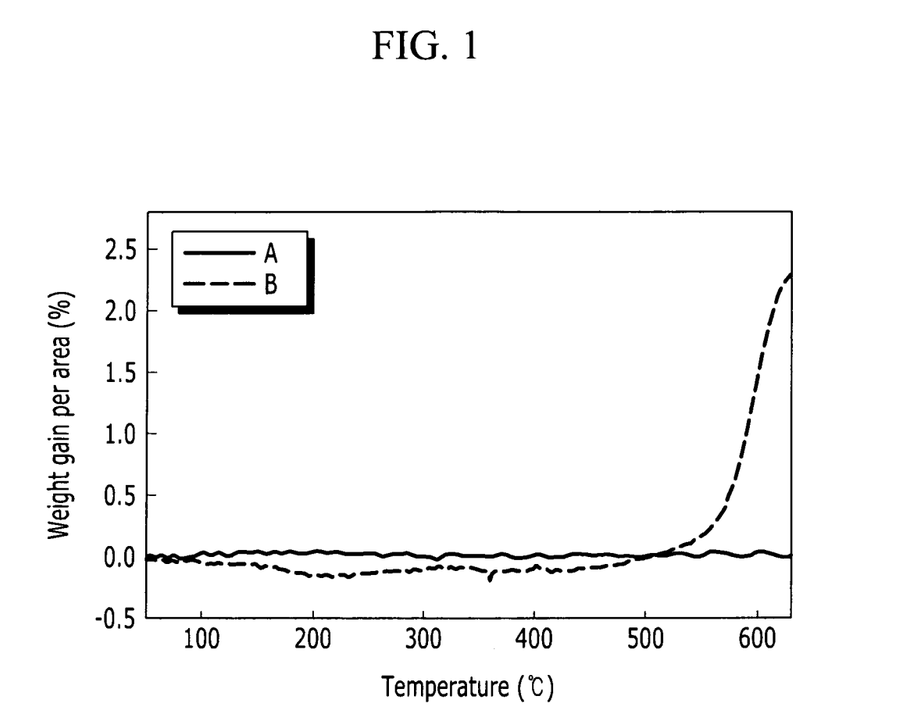
FIG. 1 provides a graph showing weight gain of an aluminum-based amorphous metal and a pure aluminum powder depending on temperature according to example embodiments.

FIG. 1 provides a graph showing weight gain of an aluminum-based amorphous metal and pure aluminum powder depending on temperature according to example embodiments.

Referring to FIG. 1, an aluminum-based amorphous metal, $Al_{86}Ni_8La_6$ (A), may not have a large weight gain at about 600° C., a temperature of firing a conductive paste, while a pure aluminum powder (B) may have a relatively sharp weight gain at the same temperature. Accordingly, an amorphous metal may not be oxidized much when heat-treated up to the temperature of firing a conductive paste, while a pure aluminum powder is oxidized and forms aluminum oxide and thus sharply gains weight when heat-treated up to the temperature.

On the other hand, the amorphous metal may gain a weight of about 4 mg/cm$^2$ or less at a temperature of firing a conductive paste, for example, a temperature ranging from about 300° C. to about 1,000° C.

The amorphous metal may have a thickness increase of about 30 μm or less when heat-treated up to a temperature of firing a conductive paste, for example, a temperature ranging from about 300° C. to about 1,000° C.

Hereinafter, examples of an amorphous metal, e.g., an aluminum-based amorphous metal, a nickel-based amorphous metal, and a copper-based amorphous metal, are illustrated regarding oxidation resistance referring to FIGS. 2 to 5.

FIGS. 2 to 5 show oxidation resistance of an amorphous metal measured by using a ribbon-shaped sample with a size of about 4 mm×8 mm and a thickness of about 50 μm and heating a conductive paste in the sample from room temperature to the firing temperature of the conductive paste at a speed of 40K/min.

Figure 2:
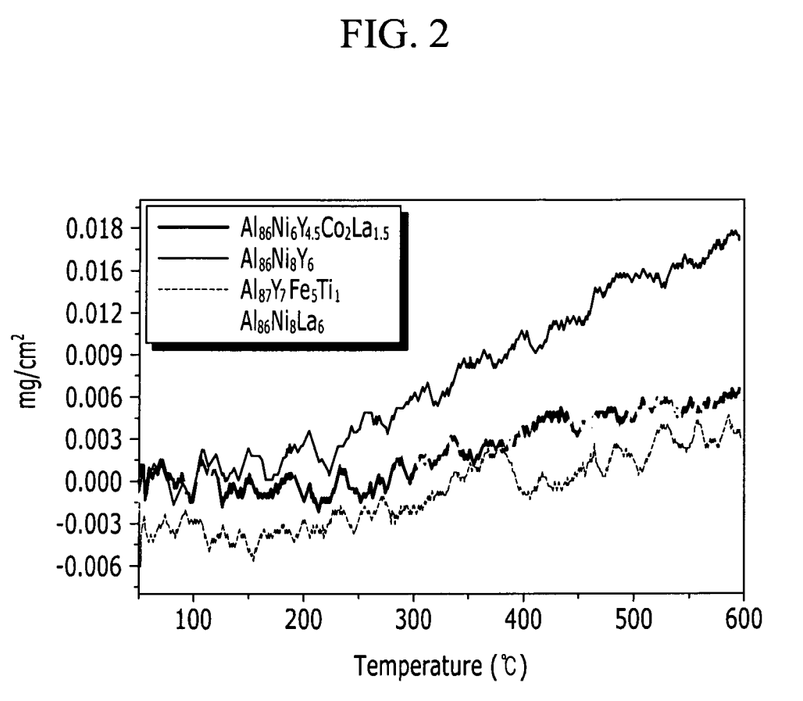
FIG. 2 provides a graph showing weight gain of an aluminum-based amorphous metal depending on temperature according to example embodiments.
Figure 3:
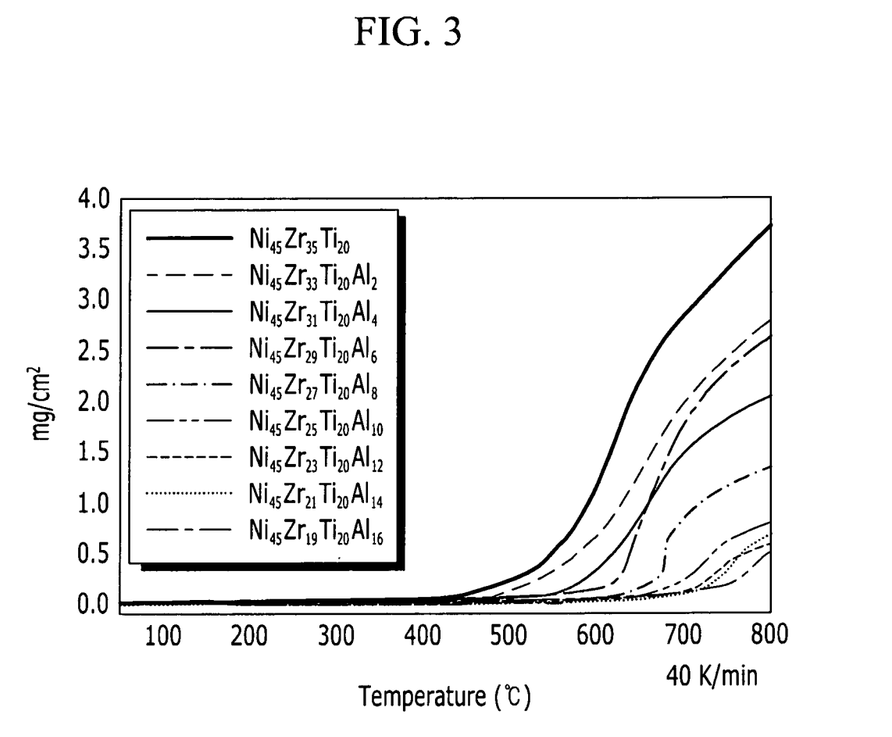
FIG. 3 provides a graph showing weight gain of a nickel-based amorphous metal depending on temperature according to example embodiments.
Figure 4:
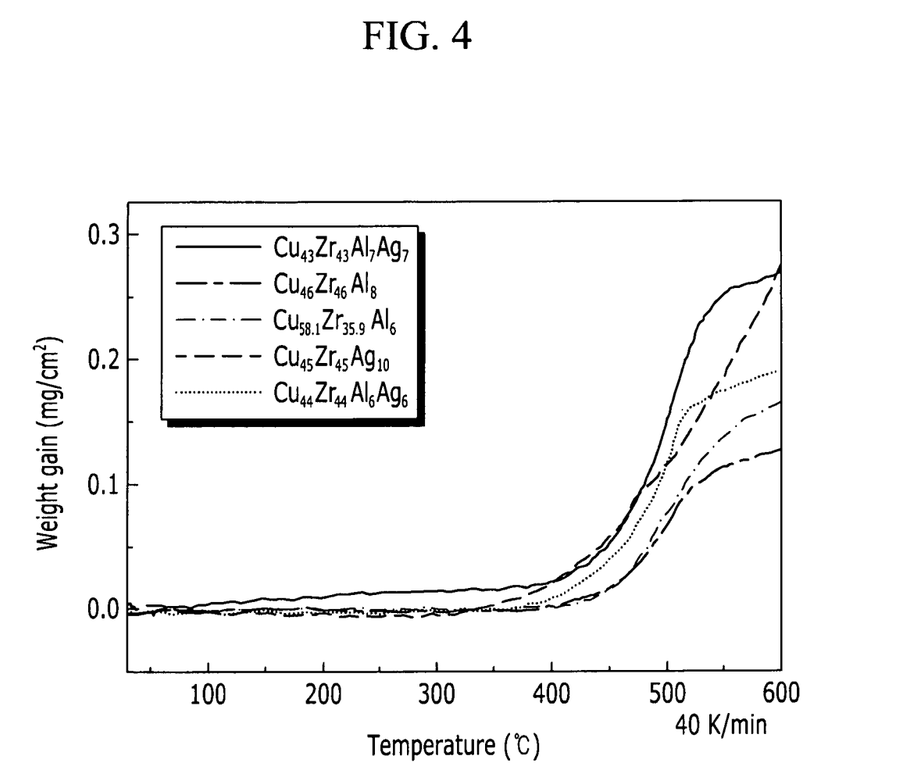
FIG. 4 provides a graph showing weight gain of a copper-based amorphous metal depending on temperature according to example embodiments.
Figure 5:
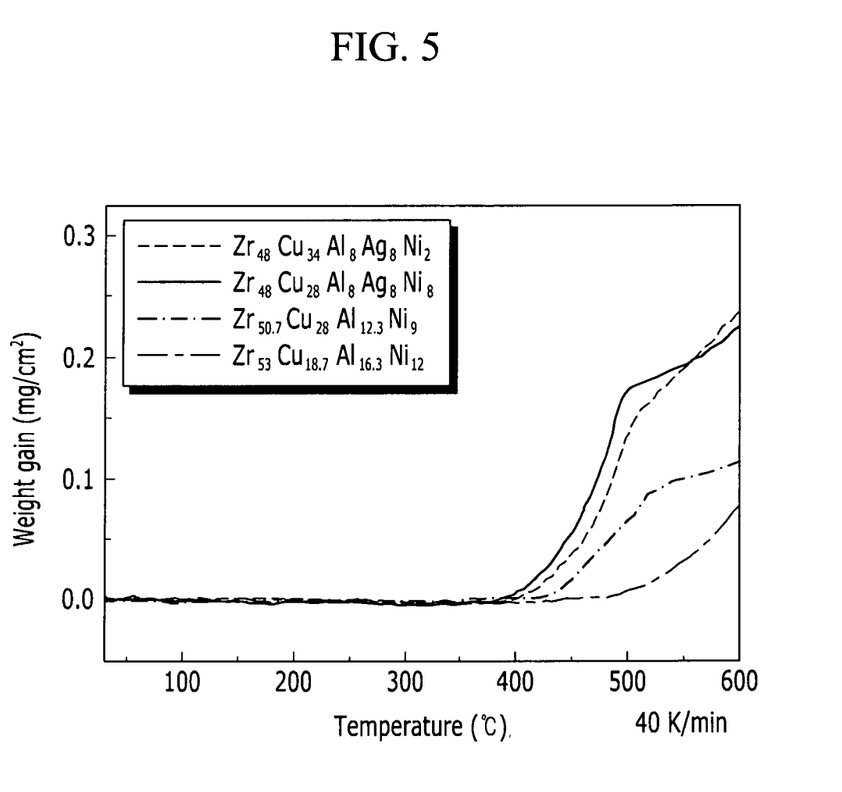
FIG. 5 provides a graph showing weight gain of a zirconium-based amorphous metal depending on temperature according to example embodiments.

FIG. 2 provides a graph showing weight gain of an aluminum-based amorphous metal depending on temperature according to example embodiments. FIG. 3 provides a graph showing weight gain of a nickel-based amorphous metal depending on temperature according to example embodiments. FIG. 4 provides a graph showing weight gain of a copper-based amorphous metal depending on temperature according to example embodiments. FIG. 5 provides a graph showing weight gain of a zirconium-based amorphous metal depending on temperature according to example embodiments.

Referring to FIG. 2, when the aluminum-based amorphous metals, e.g., $Al_{86}Ni_6Y_{4.5}Co_2La_{1.5}$, $Al_{86}Ni_8Y_6$, $Al_{87}Y_7Fe_5Ti$, and $Al_{86}Ni_8La_6$, are heated from room temperature up to about 600° C. at a speed of about 40K/min, the aluminum-based amorphous metal may have a weight gain of about 4 mg/cm$^2$ or less, and in particular, from about 0.0001 mg/cm$^2$ to about 0.02 mg/cm$^2$.

Referring to FIG. 3, when the nickel-based amorphous metals, e.g., $Ni_{45}Zr_{35}Ti_{20}$, $Ni_{45}Zr_{33}Ti_{20}Al_2$, $Ni_{45}Zr_{31}Ti_{20}Al_4$, $Ni_{45}Zr_{29}Ti_{20}Al_6$, $Ni_{45}Zr_{27}Ti_{20}Al_8$, $Ni_{45}Zr_{25}Ti_{20}Al_{10}$, $Ni_{45}Zr_{23}Ti_{20}Al_{12}$, $Ni_{45}Zr_{21}Ti_{20}Al_{14}$, and $Ni_{45}Zr_{19}Ti_{20}Al_{16}$, are heat-treated from room temperature up to about 800° C. at a speed of 40K/min, the nickel-based amorphous metal may have a weight gain of about 4 mg/cm$^2$ or less, and in particular, from about 0.5 mg/cm$^2$ to about 4.0 mg/cm$^2$.

Referring to FIG. 4, when the copper-based amorphous metals, e.g., $Cu_{43}Zr_{43}Al_7Ag_7$, $Cu_{46}Zr_{46}Al_8$, $Cu_{58.1}Zr_{35.9}Al_6$, $Cu_{45}Zr_{45}Ag_{10}$, and $Cu_{44}Zr_{44}Al_6Ag_6$, are heated from room temperature up to about 600° C. at a speed of about 40K/min or more, the copper-based amorphous metal may have a weight gain of about 4 mg/cm$^2$ or less, and in particular, from about 0.01 mg/cm$^2$ to about 0.3 mg/cm$^2$.

Referring to FIG. 5, when the zirconium-based amorphous metals, e.g., $Zr_{48}Cu_{34}Al_8Ag_8Ni_2$, $Zr_{48}Cu_{28}Al_8Ag_8Ni_8$, $Zr_{50.7}Cu_{28}Al_{12.3}Ni_9$, and $Zr_{53}Cu_{18.7}Al_{16.3}Ni_{12}$, are heated from room temperature up to about 600° C. at a speed of 40K/min or more, the zirconium-based amorphous metal may have a weight gain of about 4 mg/cm$^2$ or less, and in particular, from about 0.01 mg/cm$^2$ to about 0.3 mg/cm$^2$.

Figure 6:
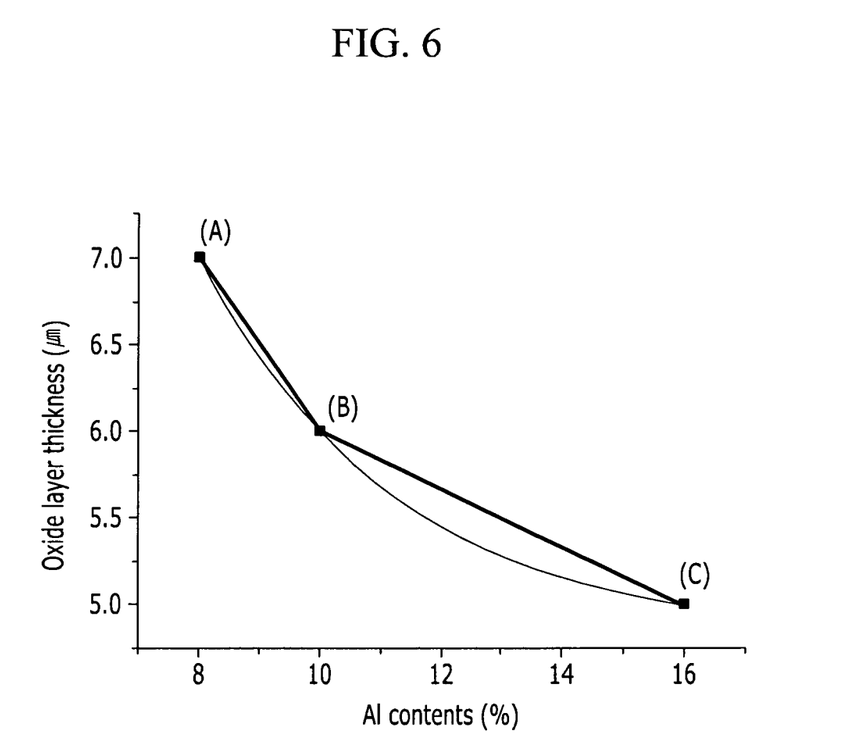
FIG. 6 provides thickness increase of a nickel-based amorphous metal depending on the amount of aluminum when heated in a process furnace at a firing temperature according to example embodiments.

FIG. 6 provides a graph showing a thickness increase depending on the amount of aluminum when an amorphous metal is heat-treated in a process furnace up to a firing temperature according to example embodiments.

Referring to FIG. 6, when $Ni_{45}Zr_{27}Ti_{20}Al_8$ (A), $Ni_{45}Zr_{25}Ti_{20}Al_{10}$ (B), and $Ni_{45}Zr_{19}Ti_{20}Al_{16}$ (C) are heat-treated in a process furnace up to a firing temperature, if more aluminum is included during the heat treatment, the thickness increase of an oxide layer produced by the amorphous metal may be less. In other words, when the nickel-based amorphous metal includes aluminum at about 16 at %, and in particular, at about 10 at % and about 8 at %, the nickel-based amorphous metal may have a thickness increase of about 5.0 μm, and in particular, of about 6.0 μm and about 7.0 μm. When an amorphous metal includes aluminum in an amount of almost 0, the amorphous metal may have a thickness increase of about 30 μm.

The amorphous metal may be included in an amount of about 5 wt % to about 100 wt % based on the total amount of the conductive component. The conductive component may further include a conductive powder.

The conductive powder may be a silver (Ag)-containing metal (e.g., silver or a silver alloy), an aluminum (Al)-containing metal (e.g., aluminum or an aluminum alloy), a copper (Cu)-containing metal (e.g., copper (Cu) or a copper alloy), a nickel (Ni)-containing metal (e.g., nickel (Ni) or a nickel alloy), or a combination thereof. However, the conductive powder is not limited thereto, may include other metals and an additive other than the metals.

The conductive powder may have a size (e.g., average largest particle size) ranging from about 0.1 to about 50 micrometers (μm). The amorphous metal and the metal powder may be included in amounts of about 5 wt % to about 95 wt % and about 5 wt % to about 95 wt % based on the total amount of the conductive component, respectively.

The organic vehicle may include an organic compound and a solvent, and the organic compound may contact (e.g., or mixed) the conductive component to impart viscosity to the conductive paste.

The organic compound may include, for example, at least one selected from a (meth)acrylate resin, a cellulose resin (e.g., ethyl cellulose), a phenol resin, an alcohol resin, tetrafluoroethylene (e.g., TEFLON), or a combination thereof, and may further include an additive, e.g., a surfactant, a thickener, a stabilizer, or a combination thereof.

The solvent may be any solvent that is capable of dissolving or suspending any of the above compounds, and may include, for example, at least one selected from terpineol, butylcarbitol, butylcarbitol acetate, pentanediol, dipentyne, limonene, ethylene glycol alkylether, diethylene glycol alkylether, ethylene glycol alkylether acetate, diethylene glycol alkylether acetate, diethylene glycol dialkylether acetate, triethylene glycol alkylether acetate, triethylene glycol alkylether, propylene glycol alkylether, propylene glycol phenylether, dipropylene glycol alkylether, tripropylene glycol alkylether, propylene glycol alkylether acetate, dipropylene glycol alkylether acetate, tripropylene glycol alkyl ether acetate, dimethylphthalic acid, diethylphthalic acid, dibutylphthalic acid, or desalted water.

The conductive paste may further include a binder. The binder is a component for improving the adherence with a lower layer, and may include, for example, a glass frit, a metallic glass, or a combination thereof. The conductive paste is prepared according to screen printing, and is used for an electrode for an electronic device.

Figure 7A:
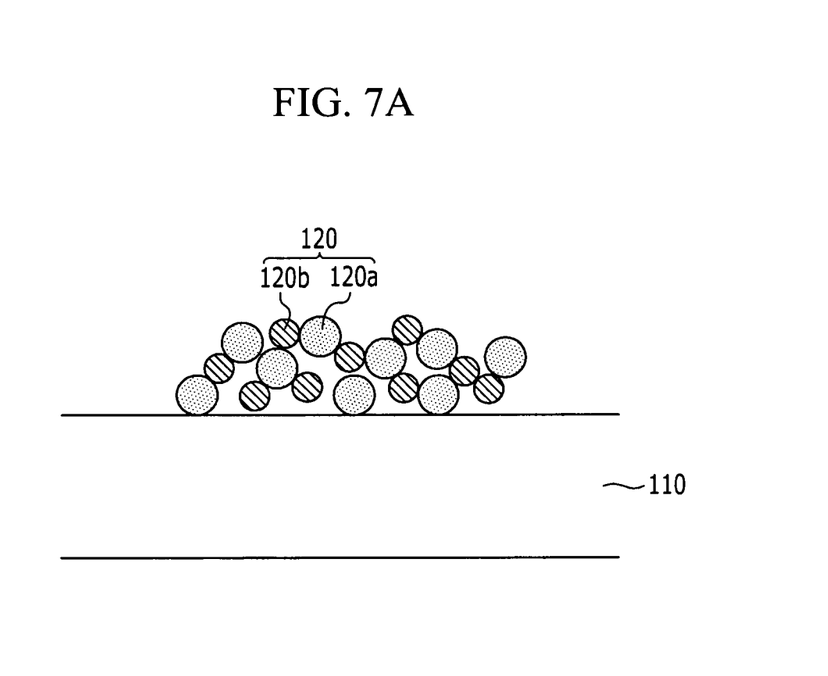
FIGS. 7A and 7B provide a schematic diagram showing a process of applying and heat-treating a conductive paste on a substrate according to example embodiments.
Figure 7B:
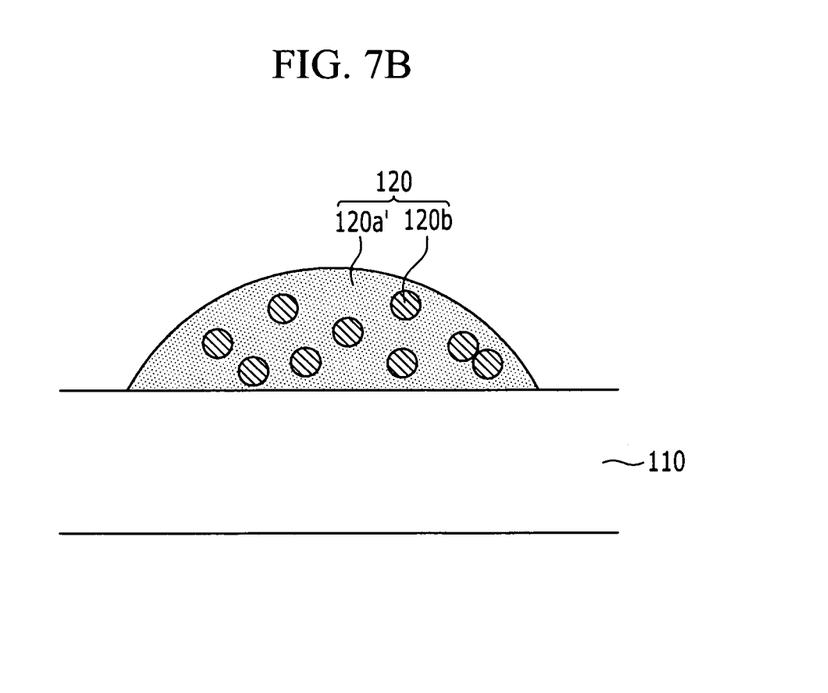

Hereinafter, an electrode fabricated by using the conductive paste is illustrated referring to FIGS. 7A and 7B. FIGS. 7A and 7B provide schematic diagrams showing a process of applying and heat-treating a conductive paste on a substrate according to example embodiments.

Referring to FIG. 7A, a conductive paste 120 including an amorphous metal 120a and a conductive powder 120b may be applied on a substrate 110. The amorphous metal 120a and the conductive powder 120b may be respectively mixed as particles, but the conductive powder 120b may be omitted.

Referring to FIG. 7B, when the amorphous metal 120a is heated higher than a glass transition temperature (Tg), the amorphous metal 120a becomes softened and liquid-like, and thus applies wettability to the metal powder 120b. The liquid-like amorphous metal 120a' fills gaps among the metal powder particles 120b and electrically connects the neighboring metal powder particles 120b.

The conductive paste 120 is fired at a higher temperature, and for example, at a temperature ranging from about 300° C. to about 1,000° C., fabricating an electrode. The electrode may be used as a conductive electrode in various electronic devices, for example, a solar cell.

Figure 8:
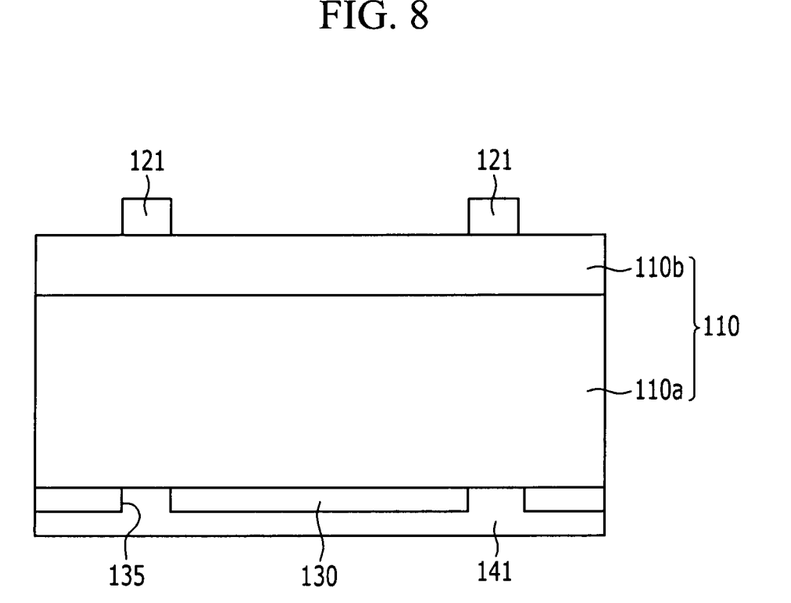
FIG. 8 is a cross-sectional view showing a solar cell according to example embodiments.

Referring to FIG. 8, a solar cell according to example embodiments is disclosed in further detail. FIG. 8 is a cross-sectional view showing a solar cell according to example embodiments.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, the spatial relationship of components will be described with respect to a semiconductor substrate 110 for better understanding and ease of description, but the present disclosure is not limited thereto. In addition, a solar energy incident side of a semiconductor substrate 110 is termed a front side, and the opposite side is called a rear side, although alternative configurations are possible.

Referring to FIG. 8, a solar cell according to example embodiments may include a semiconductor substrate 110 including a lower semiconductor layer 110a and an upper semiconductor layer 110b.

The semiconductor substrate 110 may include crystalline silicon or a compound semiconductor. The crystalline silicon may be, for example, a silicon wafer. Either of the lower semiconductor layer 110a and the upper semiconductor layer 110b may be a semiconductor layer doped with a p-type impurity, while the other may be a semiconductor layer doped with an n-type impurity. For example, the lower semiconductor layer 110a may be a semiconductor layer doped with a p-type impurity, and the upper semiconductor layer 110b may be a semiconductor layer doped with an n-type impurity. Herein, the p-type impurity may be a Group III element, e.g., boron (B), and the n-type impurity may be a Group V element, e.g., phosphorus (P).

The surface of the upper semiconductor layer 110b may be textured, and the textured surface may be provided by surface texturing. The surface-textured upper semiconductor layer 110b may have protrusions and depressions, and may include a pyramidal shape, or may have a porous structure having a honeycomb shape, for example. The surface-textured upper semiconductor layer 110b may have an enhanced surface area to improve the light-absorption rate and decrease reflectivity, thereby improving efficiency of a solar cell.

A front electrode 121 may be disposed on the upper semiconductor layer 110b. The front electrode 121 may be arranged in parallel to the direction of the substrate and may have a grid pattern shape to reduce shadowing loss and sheet resistance.

The front electrode 121 may be formed by screen printing a conductive paste followed by firing. Accordingly, the front electrode 121 may be fabricated by firing a conductive paste including the aforementioned amorphous metal.

The front electrode 121 may be eutectic with a semiconductor material forming the semiconductor substrate 110, for example, silicon (Si), and may form a eutectic layer (not shown). Herein, the eutectic layer may be formed inside the upper semiconductor layer 110b.

A bus bar electrode (not shown) may be disposed on the front electrode 121. The bus bar electrode can connect adjacent solar cells of a plurality of solar cells.

A dielectric layer 130 may be disposed under the semiconductor substrate 110. The dielectric layer 130 may increase efficiency of a solar cell by substantially or effectively preventing or inhibiting recombination of electric charges and leaking of electric current. The dielectric layer 130 may include a through-hole 135. Through the through-hole 135, a rear electrode 141, which is further disclosed below, may contact the semiconductor substrate 110.

The dielectric layer 130 may include silicon oxide ($SiO_2$), silicon nitride ($SiN_x$), aluminum oxide ($Al_2O_3$), or a combination thereof, and may have a thickness of about 100 to about 2,000 angstroms (Å).

The rear electrode 141 may be disposed under the dielectric layer 130. The rear electrode 141 may include a conductive material, for example, an opaque metal (e.g., aluminum (Al)). The rear electrode 141 may be formed using a screen printing method using a conductive paste in the same manner as the front electrode 121.

Hereinafter, a method of manufacturing the solar cell is disclosed with reference to FIG. 8. A semiconductor substrate 110, which may be a silicon wafer, is prepared. The semiconductor substrate 110 may be doped with a p-type impurity, for example.

The semiconductor substrate 110 may be subjected to a surface texturing treatment. The surface-texturing treatment may be performed with a wet method using a strong acid, e.g., nitric acid or hydrofluoric acid, or a strong base, e.g., sodium hydroxide, or by a dry method, e.g., plasma treatment.

The semiconductor substrate 110 may be doped with an n-type impurity, for example. The n-type impurity may be doped by diffusing $POCl_3$, or $H_3PO_4$ at a higher temperature. The semiconductor substrate 110 includes a lower semiconductor layer 110a and an upper semiconductor layer 110b doped with different impurities.

A conductive paste for a front electrode may be applied on the upper semiconductor layer 110b. The conductive paste for a front electrode may include a conductive component including an amorphous metal, and an organic vehicle, and is applied using a screen printing method.

The amorphous metal may be prepared using any suitable method, e.g., melt spinning, infiltration casting, gas atomization, ion irradiation, or mechanical alloying. The conductive paste for a front electrode may be dried.

A dielectric layer 130 may be provided by laminating aluminum oxide (e.g., $Al_2O_3$) or silicon oxide (e.g., $SiO_2$) on the rear side of the semiconductor substrate 110, for example, in a plasma enhanced chemical vapor deposition (PECVD) method.

The through-hole 135 may be provided on a portion of the dielectric layer 130 by ablation with a laser, for example. The conductive paste for a rear electrode is subsequently applied on a side of the dielectric layer 130 using a screen printing method. The conductive paste for a rear electrode is then dried.

The conductive pastes for the front and rear electrodes are heat treated, e.g., co-fired at the same time. The conductive pastes for the front and rear electrodes may be heat-treated individually.

The firing may be performed at a temperature that is higher than the melting temperature of the conductive component in a furnace, for example, at a temperature ranging from about 300° C. to about 1,000° C.

Accordingly, the front electrode 121 may be fabricated by firing a conductive paste for a front electrode, while the rear electrode 141 may be fabricated by firing a conductive paste for a rear electrode.

Figure 9:
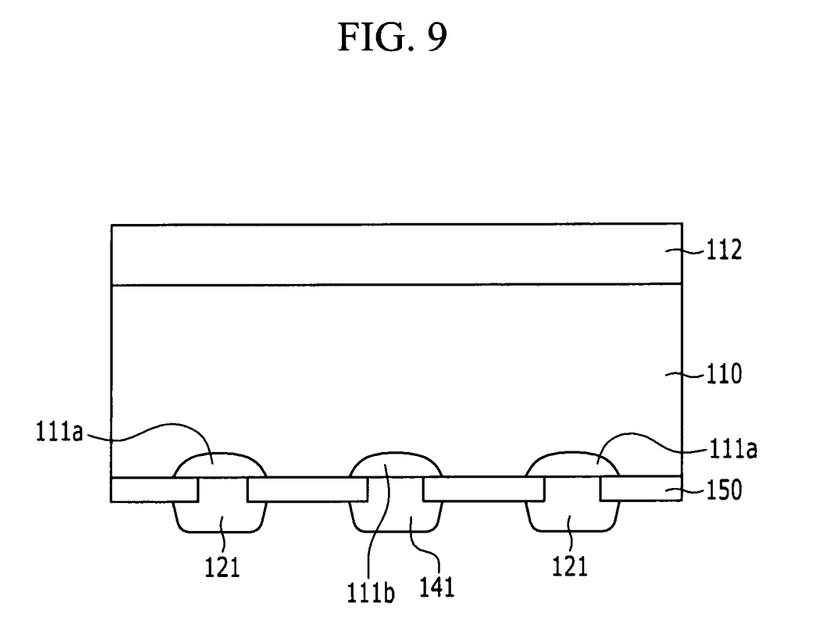
FIG. 9 is a cross-sectional view showing a solar cell according to example embodiments.

Hereinafter, a solar cell according to example embodiments is disclosed referring to FIG. 9. FIG. 9 is a cross-sectional view showing a solar cell according to example embodiments.

A solar cell may include a semiconductor substrate 110 doped with a p-type or an n-type impurity. The semiconductor substrate 110 may include a first doping region 111a and a second doping region 111b. The first doping region 111a and second doping region 111b may be provided on the rear side of the semiconductor substrate 110 and may be doped with different impurities. For example, the first doping region 111a may be doped with an n-type impurity, and the second doping region 111b may be doped with a p-type impurity. The first doping region 111a and the second doping region 111b may be alternately disposed on the rear side of the semiconductor substrate 110.

The front side of the semiconductor substrate 110 may be surface-textured, and therefore may enhance the light-absorption rate and decrease the reflectivity, thereby improving efficiency of a solar cell.

An insulation layer 112 may be provided on the semiconductor substrate 110. The insulation layer 112 may include an insulating material that absorbs little light, for example, silicon nitride (SiNx), silicon oxide ($SiO_2$), titanium oxide ($TiO_2$), aluminum oxide ($Al_2O_3$), magnesium oxide (MgO), cerium oxide ($CeO_2$), or a combination thereof. The insulation layer 112 may be a single layer or more than one layer. The insulation layer 112 may have a thickness ranging from about 200 Å to about 1,500 Å.

The insulation layer 112 may be an anti-reflective coating (ARC) that decreases the reflectivity of light and increases selectivity of a particular wavelength region on the surface of the solar cell, and simultaneously improves contact properties of silicon on the surface of the semiconductor substrate 110, thereby increasing efficiency of the solar cell.

A dielectric layer 150 including a plurality of through-holes may be disposed on the rear side of the semiconductor substrate 110. The front electrode 121 electrically connected with the first doping region 111a and the rear electrode 141 electrically connected with the second doping region 111b may be disposed on the rear side of the semiconductor substrate 110. The front electrode 121 and the first doping region 111a may contact through a through-hole, and the rear electrode 141 and the second doping region 111b may contact through a through-hole.

The front electrode 121 and the rear electrode 141 may be alternately disposed. As disclosed in example embodiments, the front electrode 121 and the rear electrode 141 may be disposed using a conductive paste including a conductive component including an amorphous metal and an organic vehicle, which is the same as described above.

A solar cell according to example embodiments may include both of the front electrode 121 and the rear electrode 141 on the rear surface of the solar cell unlike the solar cell described above. Thereby, an area where a metal is disposed on the front surface may be decreased such that shadowing loss decreases and solar cell efficiency increases.

Hereinafter, the method of manufacturing a solar cell will be further disclosed referring to FIG. 9. A semiconductor substrate 110 doped with, for example, an n-type impurity is prepared. The semiconductor substrate 110 is surface-textured, and the insulation layer 112 and the dielectric layer 150 are disposed on the front and rear sides of the semiconductor substrate 110, respectively. The insulation layer 112 and the dielectric layer 150 may be provided by chemical vapor deposition (CVD), for example.

The first doping region 111a and the second doping region 111b may be disposed by sequentially doping a p-type impurity and an n-type impurity at a relatively high concentration on the rear side of the semiconductor substrate 110.

A conductive paste for a front electrode may be applied on a portion of the dielectric layer 150 corresponding to the first doping region 111a, and a conductive paste for a rear electrode may be applied on a portion of the dielectric layer 150 corresponding to the second doping region 111b. The conductive paste for the front electrode and the conductive paste for the rear electrode may be disposed by a screen printing method, for example, wherein the conductive paste may include a conductive component including an amorphous metal, and an organic vehicle.

The conductive paste for the front electrode and the conductive paste for the rear electrode may be fired together or separately. The firing may be performed in a furnace at a temperature that is higher than the melting temperature of a conductive component.

Herein, the conductive paste is applied to provide an electrode for a solar cell, but may be used for an electrode for other electronic devices, e.g., a plasma display panel (PDP), a liquid crystal display (LCD), and an organic light emitting diode (OLED).

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

What is claimed is:

1. A conductive paste comprising:
    a conductive component including an amorphous metal, the amorphous metal having a lower resistivity after a crystallization process than before the crystallization process, and at least one of a weight gain of about 4 $mg/cm^2$ or less and a thickness increase of about 30 μm or less after being heated in a process furnace at a firing temperature; and
    an organic vehicle, wherein the resistivity of the amorphous metal is lower by about 34% or more after the crystallization process.

2. The conductive paste of claim 1, wherein the resistivity of the amorphous metal is lower by about 59% to about 99% after the crystallization process.

3. The conductive paste of claim 2, wherein the amorphous metal comprises $Al_{86}Ni_8Y_6$, $Al_{84.5}Ni_{5.5}Y_{10}$, $Al_{86}Ni_6CO_2Y_6$, $Al_{87}Y_7Fe_5Ti_1$, $Al_{88}Y_7Fe_5$, $Al_{86}Ni_6Co_2Y_6$, $Al_{87}Y_7Fe_5Ti_1$, $Al_{88}Y_7Fe_5$, $Al_{86}La_5Ni_9$, $Al_{86}La_6Ni_8$, $Al_{85}La_6Ni_9$, $Al_{85}La_5Ni_{10}$, $Al_{85.5}Ni_{9.5}La_5$, $Ni_{59}Zr_{20}Ti_{21}$, or a combination thereof.

4. The conductive paste of claim 1, wherein the amorphous metal is crystallized by a heat treatment in a process furnace at a temperature ranging from about 300° C. to about 800° C. and exposure to air.

5. The conductive paste of claim 1, wherein the weight gain of the amorphous metal ranges from about 0.0001 mg/cm$^2$ to about 4 mg/cm$^2$.

6. The conductive paste of claim 1, wherein the firing temperature ranges from about 300° C. to about 1,000° C.

7. The conductive paste of claim 1, wherein the at least one of weight gain and thickness increase of the amorphous metal is measured when the conductive paste is heat-treated from room temperature up to the firing temperature at a speed of about 40K/min or more.

8. The conductive paste of claim 1, wherein the thickness increase of the amorphous metal is equal to the thickness of an oxide layer of the amorphous metal when the conductive paste is heated up to the firing temperature.

9. The conductive paste of claim 1, wherein the amorphous metal includes at least one of aluminum (Al), nickel (Ni), copper (Cu), zirconium (Zr), iron (Fe), calcium (Ca), cobalt (Co), tin (Sn), zinc (Zn), tantalum (Ta), magnesium (Mg), lanthanum (La), niobium (Nb), lead (Pb), neodymium (Nd), gadolinium (Gd), scandium (Sc), yttrium (Y), ytterbium (Yb), cerium (Ce), sodium (Na), barium (Ba), potassium (K), rubidium (Rb), cesium (Cs), lithium (Li), mercury (Hg), hafnium (Hf), antimony (Sb), cadmium (Cd), indium (In), bismuth (Bi), tungsten (W), vanadium (V), arsenic (As), gallium (Ga), germanium (Ge), manganese (Mn), technetium (Tc), beryllium (Be), rhodium (Rh), iridium (Ir), chromium (Cr), osmium (Os), ruthenium (Ru), rhenium (Re), molybdenum (Mo), palladium (Pd), platinum (Pt), gold (Au), carbon (C), silicon (Si), phosphorus (P), and boron (B).

10. The conductive paste of claim 1, wherein the amorphous metal is included in the conductive component in an amount of about 5 wt % to about 100 wt % based on a total wt % of the conductive component.

11. The conductive paste of claim 1, wherein the conductive component further includes a metal powder.

12. The conductive paste of claim 11, wherein the metal powder includes at least one of silver (Ag), aluminum (Al), copper (Cu), and nickel (Ni).

13. The conductive paste of claim 11, wherein the amorphous metal and the metal powder are included in amounts of about 5 wt % to about 95 wt %, respectively, based on a total wt % of the conductive component.

14. The conductive paste of claim 1, further comprising a binder.

15. The conductive paste of claim 14, wherein the binder includes at least one of glass frit and metallic glass.

16. An electronic device comprising:
an electrode including a fired conductive paste, the fired conductive paste including a conductive component,
wherein the conductive component includes an amorphous metal having a lower resistivity after a crystallization process than before the crystallization process, and at least one of a weight gain of about 4 mg/cm$^2$ or less and a thickness increase of about 30 μm or less after being heated in a process furnace at a firing temperature, and
wherein the resistivity of the amorphous metal is lower by about 34% or more after the crystallization process.

17. The electronic device of claim 16, wherein the resistivity of the amorphous metal is lower by about 59% to about 99% after the crystallization process.

18. The electronic device of claim 17, wherein the amorphous metal comprises $Al_{86}Ni_8Y_6$, $Al_{84.5}Ni_{5.5}Y_{10}$, $Al_{86}Ni_6CO_2Y_6$, $Al_{87}Y_7Fe_5Ti_1$, $Al_{88}Y_7Fe_5$, $Al_{86}Ni_6Co_2Y_6$, $Al_{87}Y_7Fe_5Ti_1$, $Al_{88}Y_7Fe_5$, $Al_{86}La_5Ni_9$, $Al_{86}La_6Ni_8$, $Al_{85}La_6Ni_9$, $Al_{85}La_5Ni_{10}$, $Al_{85.5}Ni_{9.5}La_5$, $Ni_{59}Zr_{20}Ti_{21}$, or a combination thereof.

19. The electronic device of claim 16, wherein the amorphous metal includes at least one of aluminum (Al), nickel (Ni), copper (Cu), zirconium (Zr), iron (Fe), calcium (Ca), cobalt (Co), tin (Sn), zinc (Zn), tantalum (Ta), magnesium (Mg), lanthanum (La), niobium (Nb), lead (Pb), neodymium (Nd), gadolinium (Gd), scandium (Sc), yttrium (Y), ytterbium (Yb), cerium (Ce), sodium (Na), barium (Ba), potassium (K), rubidium (Rb), cesium (Cs), lithium (Li), mercury (Hg), hafnium (Hf), antimony (Sb), cadmium (Cd), indium (In), bismuth (Bi), tungsten (W), vanadium (V), arsenic (As), gallium (Ga), germanium (Ge), manganese (Mn), technetium (Tc), beryllium (Be), rhodium (Rh), iridium (Ir), chromium (Cr), osmium (Os), ruthenium (Ru), rhenium (Re), molybdenum (Mo), palladium (Pd), platinum (Pt), gold (Au), carbon (C), silicon (Si), phosphorus (P), and boron (B).

20. The electronic device of claim 16, wherein the conductive component further includes a metal powder.

21. The electronic device of claim 20, wherein the metal powder includes at least one of silver (Ag), aluminum (Al), copper (Cu), and nickel (Ni).

22. A solar cell comprising:
a semiconductor layer; and
an electrode electrically connected to the semiconductor layer, the electrode including a fired conductive paste that includes a conductive component,
wherein the conductive component includes an amorphous metal having a lower resistivity after a crystallization process than before the crystallization process, and at least one of a weight gain of about 4 mg/cm$^2$ or less and a thickness increase of about 30 μm or less after being heated in a process furnace at a firing temperature, and
wherein the resistivity of the amorphous metal is lower by about 34% or more after the crystallization process.

23. The solar cell of claim 22, wherein the resistivity of the amorphous metal is lower by about 59% to about 99% after the crystallization process.

24. The solar cell of claim 23, wherein the amorphous metal comprises $Al_{86}Ni_8Y_6$, $Al_{84.5}Ni_{5.5}Y_{10}$, $Al_{86}Ni_6CO_2Y_6$, $Al_{87}Y_7Fe_5Ti_1$, $Al_{88}Y_7Fe_5$, $Al_{86}Ni_6Co_2Y_6$, $Al_{87}Y_7Fe_5Ti_1$, $Al_{88}Y_7Fe_5$, $Al_{86}La_5Ni_9$, $Al_{86}La_6Ni_8$, $Al_{85}La_6Ni_9$, $Al_{85}La_5Ni_{10}$, $Al_{85.5}Ni_{9.5}La_5$, $Ni_{59}Zr_{20}Ti_{21}$, or a combination thereof.

25. The solar cell of claim 22, wherein the amorphous metal includes at least one of aluminum (Al), nickel (Ni), copper (Cu), zirconium (Zr), iron (Fe), calcium (Ca), cobalt (Co), tin (Sn), zinc (Zn), tantalum (Ta), magnesium (Mg), lanthanum (La), niobium (Nb), lead (Pb), neodymium (Nd), gadolinium (Gd), scandium (Sc), yttrium (Y), ytterbium (Yb), cerium (Ce), sodium (Na), barium (Ba), potassium (K), rubidium (Rb), cesium (Cs), lithium (Li), mercury (Hg), hafnium (Hf), antimony (Sb), cadmium (Cd), indium (In), bismuth (Bi), tungsten (W), vanadium (V), arsenic (As), gallium (Ga), germanium (Ge), manganese (Mn), technetium (Tc), beryllium (Be), rhodium (Rh), iridium (Ir), chromium (Cr), osmium (Os), ruthenium (Ru), rhenium (Re), molybdenum (Mo), palladium (Pd), platinum (Pt), gold (Au), carbon (C), silicon (Si), phosphorus (P), and boron (B).

26. The solar cell of claim 22, wherein the amorphous metal is included in the conductive component in an amount of about 5 wt % to about 100 wt % based on a total wt % of the conductive component.

27. The solar cell of claim 22, wherein the conductive component further includes a metal powder.

28. The solar cell of claim 27, wherein the amorphous metal and the metal powder are included in amounts of about 5 wt % to about 95 wt %, respectively, based on a total wt % of the conductive component.

29. The solar cell of claim 22, further comprising:
a buffer layer on a first region of the semiconductor layer, wherein the electrode is on a second region of the semiconductor layer different from the first region.

30. The solar cell of claim 29, wherein the buffer layer includes at least one of a fired product of glass frit and metallic glass.

* * * * *